US008013748B2

(12) United States Patent
Chen et al.

(10) Patent No.: US 8,013,748 B2
(45) Date of Patent: Sep. 6, 2011

(54) SYSTEM FOR MONITORING TEMPERATURE AND SLOPE OF A WAFER AND A METHOD THEREOF

(75) Inventors: Chi-Fen Chen, Taipei County (TW); Jen Jui Cheng, Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 357 days.

(21) Appl. No.: 12/327,218

(22) Filed: Dec. 3, 2008

(65) Prior Publication Data

US 2010/0079296 A1 Apr. 1, 2010

(30) Foreign Application Priority Data

Sep. 26, 2008 (TW) .............................. 97137057 A

(51) Int. Cl.
*G08B 17/00* (2006.01)
*G06F 19/00* (2006.01)
*G01N 21/00* (2006.01)

(52) U.S. Cl. ........................ 340/584; 702/130; 356/432

(58) Field of Classification Search ................. 340/584, 340/587, 588, 589, 686.1, 686.2, 689; 438/14, 438/200; 250/339.11, 338.1; 355/68, 69; 702/130; 356/432, 69

See application file for complete search history.

(56) References Cited

U.S. PATENT DOCUMENTS

| 5,883,704 | A  | * | 3/1999  | Nishi et al. ....................... 355/67 |
| 6,080,040 | A  | * | 6/2000  | Appel et al. ...................... 451/10 |
| 7,230,709 | B2 | * | 6/2007  | Kusuda .......................... 356/432 |
| 7,454,307 | B2 | * | 11/2008 | Chiang .......................... 702/130 |
| 2003/0042419 | A1 | * | 3/2003  | Katsumata et al. ...... 250/339.11 |
| 2003/0170948 | A1 | * | 9/2003  | Bhagavat et al. ............. 438/200 |
| 2006/0160253 | A1 | * | 7/2006  | Kim et al. .......................... 438/5 |

* cited by examiner

*Primary Examiner* — Van T. Trieu
(74) *Attorney, Agent, or Firm* — Rosenberg, Klein & Lee

(57) ABSTRACT

A method for monitoring the temperature and slope of a wafer is presented, and the steps of the method comprises: (a) providing a cooling machine, a monitoring system, a sensing module, and a wafer; (b) cooling the wafer by the cooling machine; (c) sensing all regions of the wafer by the sensing module, and detecting the temperature and slope of the wafer relative to the cooling machine; (d) if the wafer's temperature is higher than a set temperature, the monitoring system outputs a first alarm signal, if the wafer's slope is greater than a set slope, the monitoring system outputs a second alarm signal.

3 Claims, 5 Drawing Sheets

US 8,013,748 B2

SYSTEM FOR MONITORING TEMPERATURE AND SLOPE OF A WAFER AND A METHOD THEREOF

BACKGROUND OF THE INVENTION

1. Field of the Invention

The present invention relates to a system for monitoring temperature and slope and a method thereof, more specifically for monitoring the temperature and slope of a wafer and a method thereof.

2. Description of Related Art

During photolithography process for manufacturing of a wafer, the wafer must be cooled by a cooling machine. The cooling machine has a sensor module for sensing the surface temperature of the wafer; when the wafer is fixed at the cooling machine, a partial region of the wafer can be sensed by the sensor module, and the sensor module then informs a monitoring system about the surface temperature of the wafer. If the surface temperature of the wafer does not conform to a set temperature established by the monitoring system, an operator will trouble-shoot for the reason and regulate the cooling machine until the surface temperature of the wafer conforms to the set temperature.

The sensor module of cooling machine only can sense a partial region of the wafer, meaning that the sensor module is incapable of sensing all regions of the wafer, so that the sensing data is not accurate. Additionally, the sensor module can not sense the slope of the wafer relative to the cooling machine, so that if the slope of the wafer relative to the cooling machine is too great, the cooling of the wafer will be less effective due to uneven cooling (refer to FIG. 1), and the cooling process's yield will be low.

Hence, the inventors of the present invention believe that the shortcomings described above can be improved upon and finally suggest the present invention which is of a reasonable design and is an effective improvement.

SUMMARY OF THE INVENTION

An object of the present invention is to provide a system for monitoring temperature and slope of a wafer and a method thereof, the yield of the wafer can be enhanced, cost can be reduced, and trouble-shooting time can be decreased due to the timely alert generated from the monitoring system.

The method for monitoring the temperature and slope of a wafer, the steps of the method comprises: (a) providing a cooling machine, a monitoring system, and a sensing module; (b) cooling the wafer by the cooling machine; (c) sensing all regions of the wafer by the sensing module, and detecting the temperature and slope of the wafer relative to the cooling machine; (d) if the temperature of the wafer is higher than a set temperature, the monitoring system outputs a first alarm signal, if the slope of the wafer is greater than a set slope, the monitoring system outputs a second alarm signal.

The system for monitoring temperature and slope of a wafer, comprises a cooling machine, a sensing module fixed at the cooling machine, and a monitoring system. The monitoring system is electrically connected with the sensing module, whereby the sensing module senses whole surface of a wafer and detects the temperature and slope of the wafer relative to the cooling machine.

DETAILED DESCRIPTION OF PREFERRED EMBODIMENTS

Figure 1:
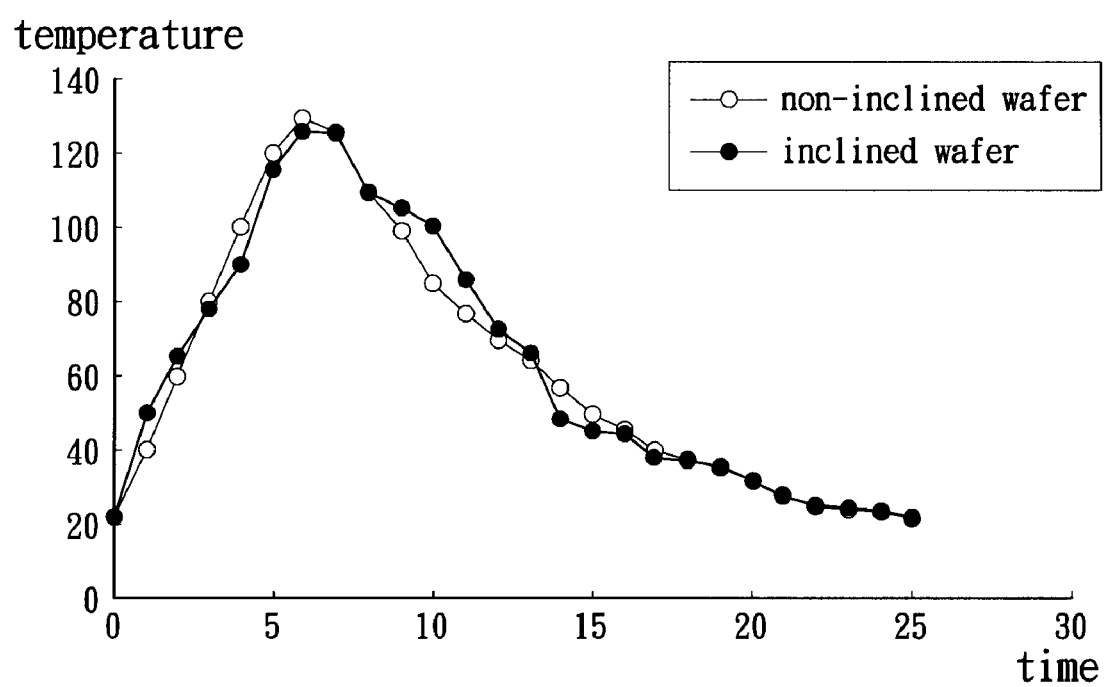
FIG. 1 is a temperature schematic view of an inclined wafer and a non-inclined wafer.
Figure 2:
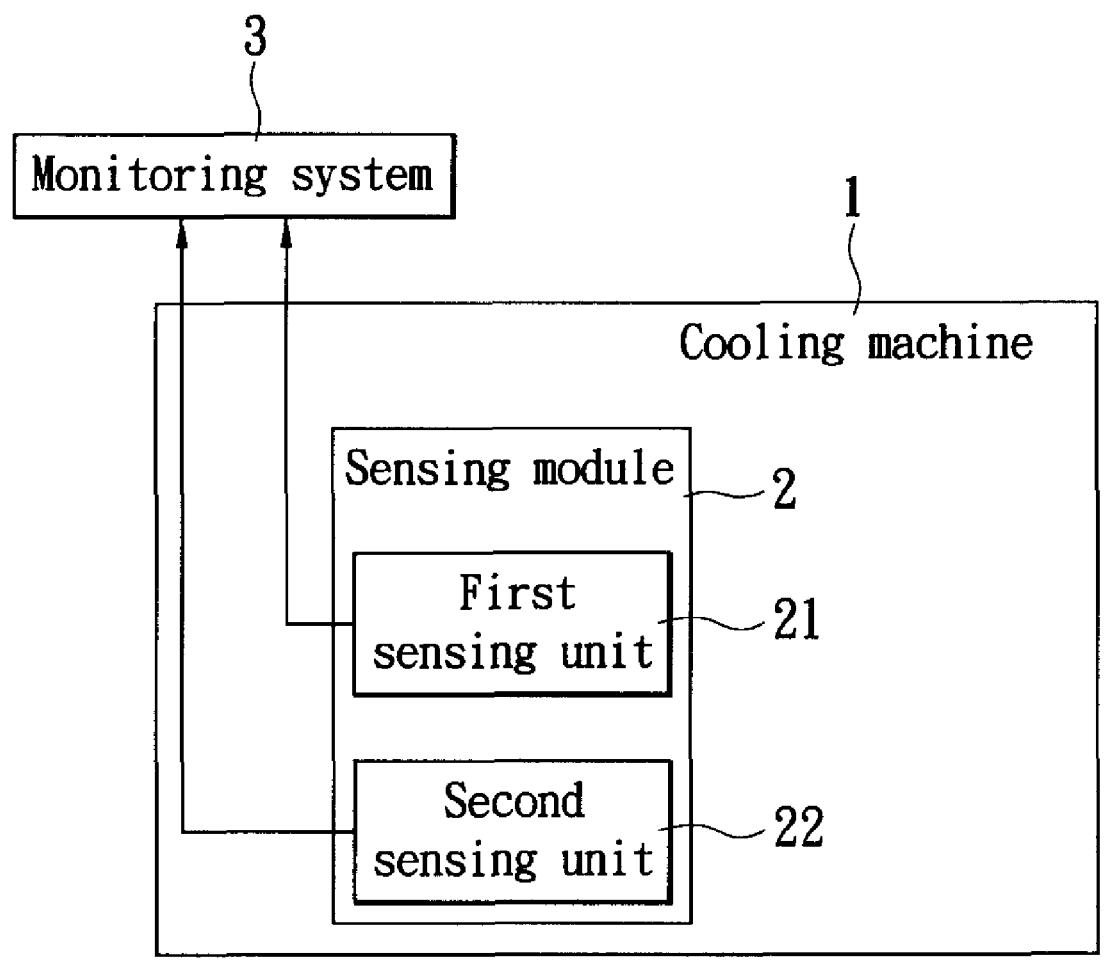
FIG. 2 is a block diagram of a system for monitoring the temperature and slope of a wafer according to the present invention.
Figure 3:
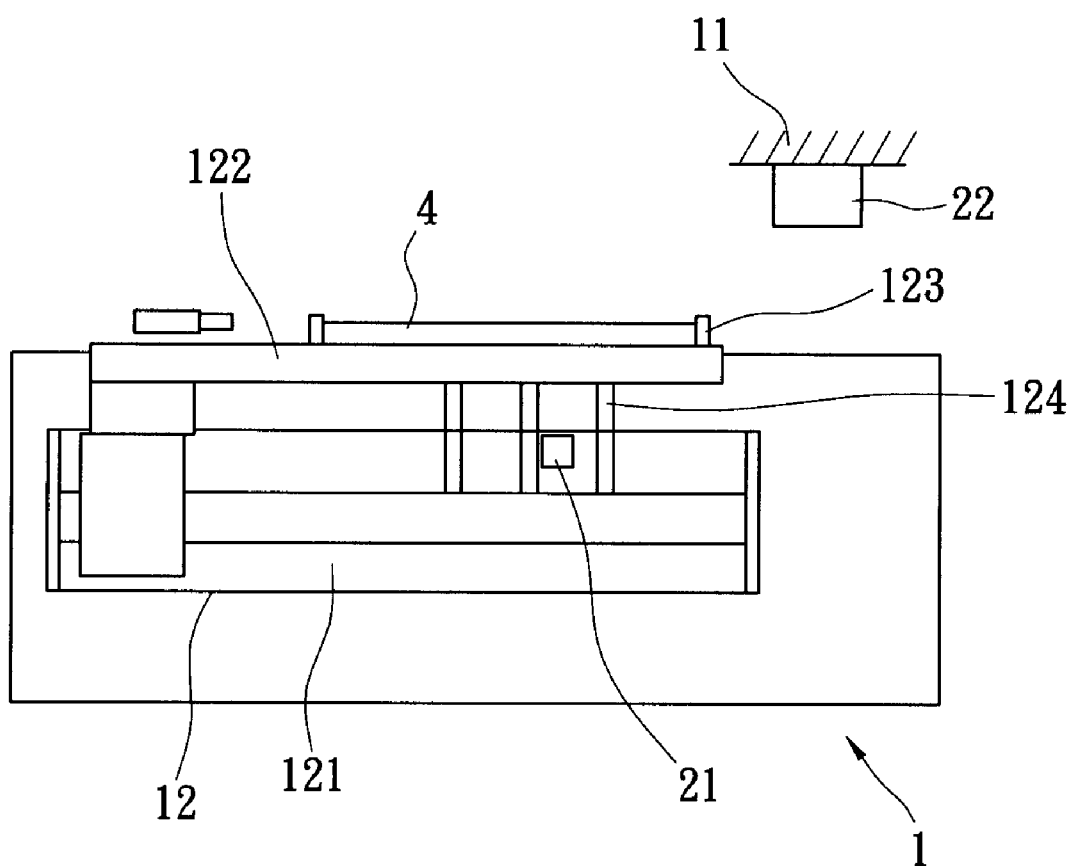
FIG. 3 is a schematic view about cooling the wafer via a cooling machine according to the present invention.

As shown in FIG. 2 and FIG. 3, the present invention provides a system comprises a cooling machine 1, a sensing module 2, and a monitoring system 3 connected with the sensing module 2. The sensing module 2 is fixed with the cooling machine 1, and is responsible for detecting the temperature of all regions of a wafer 4 relative to the cooling machine 1, and for detecting the slope of the wafer 4 relative to the cooling machine 1.

Therein the cooling machine 1 includes a fixing module 11 and a rotatable cooling module 12, and the fixing module 11 is under the rotatable cooling module 12. The rotatable cooling module 12 includes a body 121, a cooling board 122, a pair of fixing apparatus 123 for fixing the wafer 4, and a plurality of posts 124 for supporting the wafer 4. The cooling board 122 and the plurality of posts 124 are connected with the body 121, and the pair of fixing apparatus 123 is fixed at the cooling board 122. The pair of fixing apparatus 123 are responsible for clamping and stabilizing the wafer 4 mounted on the cooling board 122. The sensing module 2 includes a first sensing unit 21 and a second unit 22, and the first sensing unit 21 is embedded with the body 121, and the second unit 22 is fixed with the fixing module 11.

Figure 4:
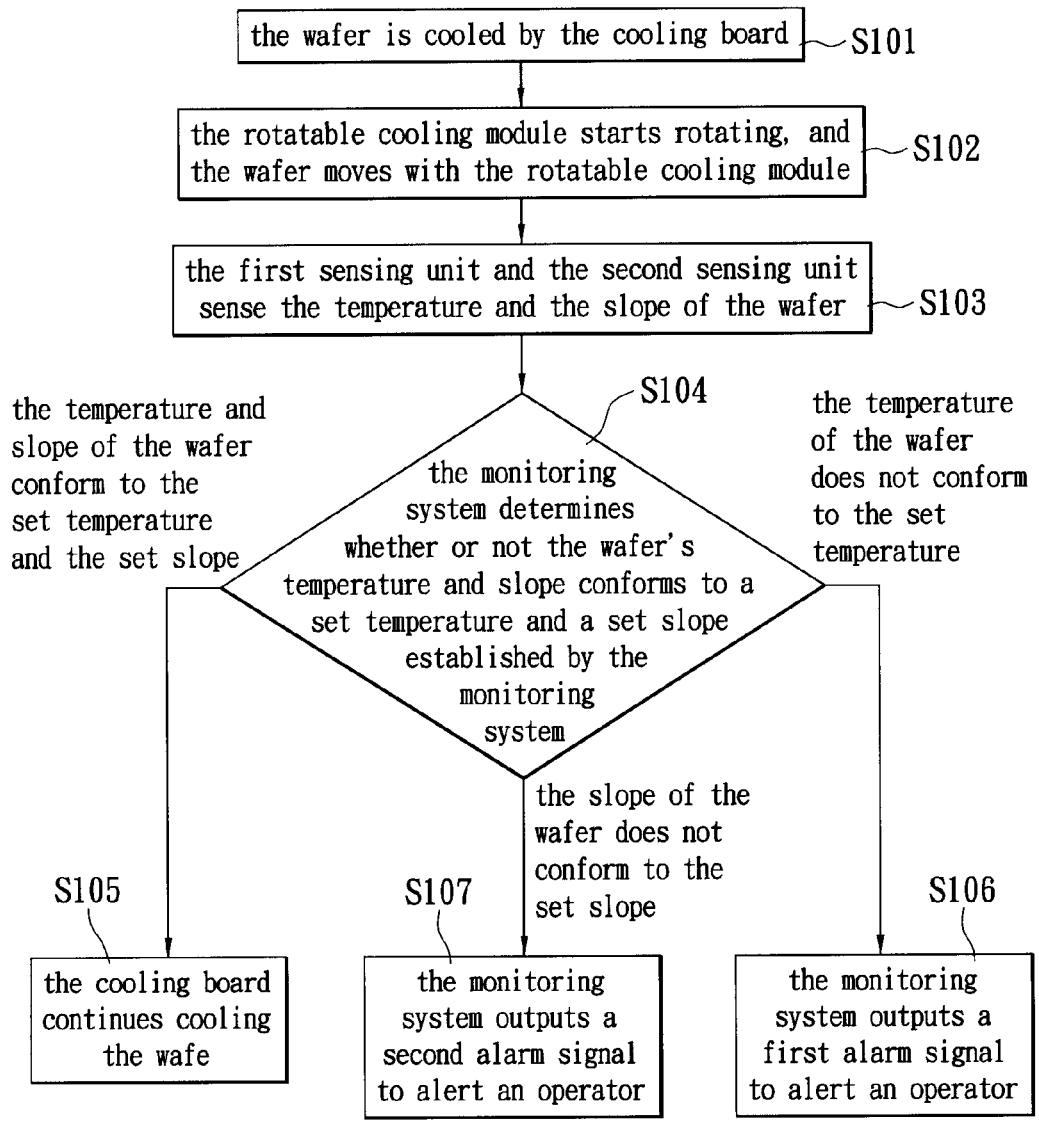
FIG. 4 is a flow chart of monitoring the temperature and slope of the wafer according to the present invention.

As shown in FIG. 3 and FIG. 4, a method for monitoring the temperature and slope of the wafer 4 is presented. The steps of the method include:

S101: the wafer 4 is placed on a surface of the cooling board 122, and between the pair of fixing apparatus 123, and the wafer 4 is cooled by the cooling board 122;

S102: the rotatable cooling module 12 starts rotating, and the wafer 4 moves with the rotatable cooling module 12;

S103: the first sensing unit 21 senses the temperature of a partial region of the wafer 4, and because the wafer 4 rotates with the rotatable cooling module 12, the second sensing unit 22 can detect the temperature of all region of the wafer 4 relative to the cooling board 122 and detect the slope of the wafer 4 relative to the cooling board 122. The first sensing unit 21 and the second sensing unit 22 transmit the detected data of the temperature and slope of the wafer 4 to the monitoring system 3;

S104: the monitoring system 3 determines whether or not the temperature and slope of the wafer 4 conforms to a set temperature and a set slope established by the monitoring system 3;

S105: if the temperature and slope of the wafer 4 conforms to the set temperature and the set slope established by the monitoring system 3, the cooling board 22 continues cooling the wafer 4;

S106: if the temperature of the wafer 4 does not conform to the set temperature established by the monitoring system 3, the cooling board 22 stops cooling the wafer 4, furthermore the monitoring system 3 outputs a first alarm signal to alert an operator, so that the operator may check whether or not the cooling machine 1 has a breakdown, so as to regulate parameters of the cooling machine 1; and S107: if the slope of the wafer 4 does not conform to the set slope established by the monitoring system 3, the cooling board 22 stops cooling the wafer 4, furthermore the monitoring system 3 outputs a second alarm signal to alert an operator, so that the operator may check whether or not the wafer 4 is mounted on the cooling board 122 with a large angle of inclination relative to the cooling machine 1.

Figure 5:
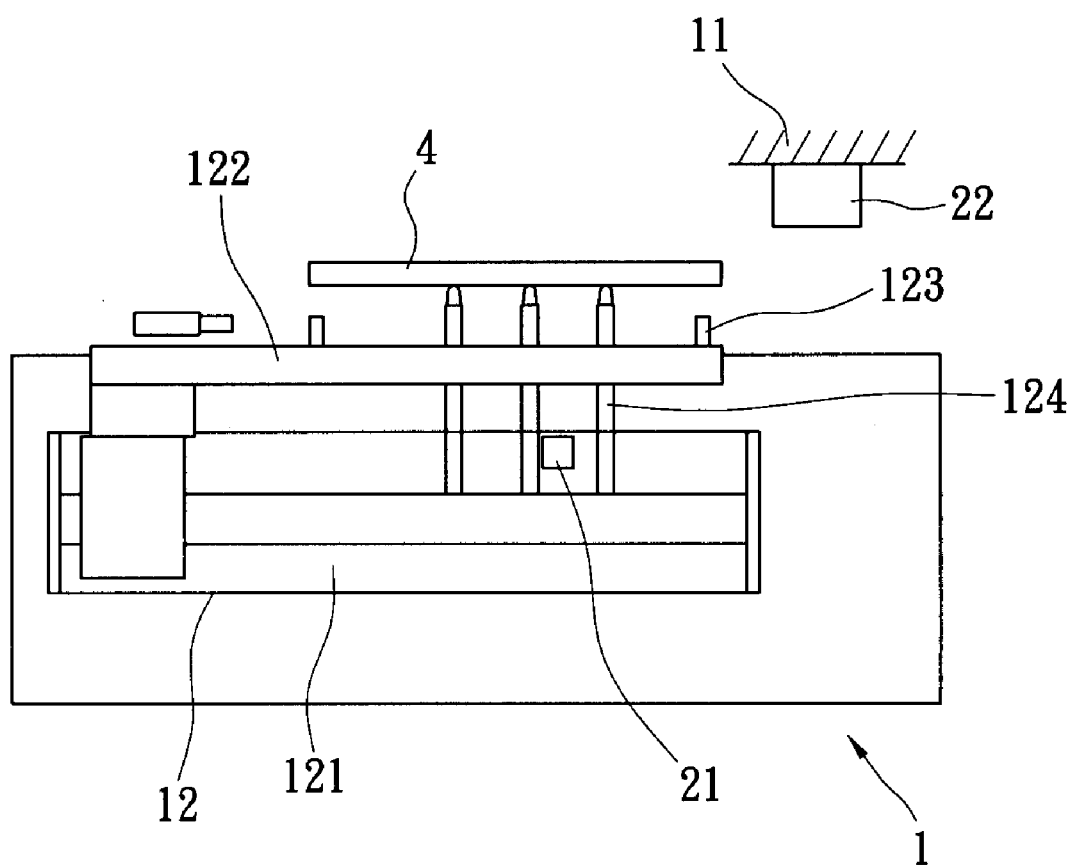
FIG. 5 is a schematic view about a finished cooling process according to the present invention.

As shown in FIG. 5, when the cooling process of the wafer 4 is finished, the plurality of posts 124 extend to support the wafer 4, and the wafer 4 is lifted from the cooling board 122. A mechanic arm will follow through to take the wafer 4 which has been cooled by the cooling board 122 away from the posts 124, and the next cooling process for the wafer 4 will start.

The efficacy of the present invention is as follows: because the sensing module 2 mounted on the cooling machine 1 can sense the temperature and slope of all regions of the wafer 4, when the temperature and slope of the wafer 4 does not conform to the set temperature and the set slope of the monitoring system 3, then the monitoring system 3 will output different alarm signals to alert the operator, so that yield of the wafer 4 is enhanced, cost of manufacturing the wafer 4 is reduced, and the trouble-shooting time is decreased.

What are disclosed above are only the specification and the drawings of the preferred embodiments of the present invention and it is therefore not intended that the present invention be limited to the particular embodiments disclosed. It will be understood by those skilled in the art that various equivalent changes may be made depending on the specification and the drawings of the present invention without departing from the scope of the present invention.

What is claimed is:

1. A method for monitoring temperature and slope of a wafer, the steps of the method comprises:
   (a) providing (1) a cooling machine including a rotatable cooling module and a fixing module on the rotatable cooling module;
   (2) a sensing module including:
   a first sensing unit arranged in the rotatable cooling module; and
   a second sensing unit arranged on the fixing module;
   (3) a monitoring system;
   (b) cooling the wafer on the rotatable cooling module;
   (c) sensing the temperature and the slope of the wafer by the first sensing unit and the second sensing unit;
   (d) forming a sensor signal from the first sensing unit and the second sensing unit, and according to the sensor signal,
   (e1) outputting a first alarm signal from the monitoring system if the temperature of the wafer is higher than a set temperature established by the monitoring system;
   (e2) outputting a second alarm signal from the monitoring system if the slope of the wafer is greater than a set slope established by the monitoring system; and
   (e3) outputting a third alarm signal from the monitoring system if the temperature and the slope of the wafer do not conform to the set temperature and the set slope established by the monitoring system.

2. The method for monitoring the temperature and slope of the wafer according to claim 1, wherein when the wafer of step (b) is fixed at the rotatable cooling module, the rotatable cooling module starts rotating.

3. The method for monitoring the temperature and slope of the wafer according to claim 2, wherein the first sensing module of step (c) sense partial region of the wafer, the second sensing module of step (c) sense all regions of the wafer so as to detect and receive data of the temperature and slope of the wafer.

* * * * *